United States Patent [19]

Nishino et al.

[11] Patent Number: 5,382,800
[45] Date of Patent: Jan. 17, 1995

[54] CHARGED PARTICLE BEAM EXPOSURE METHOD AND APPARATUS

[75] Inventors: Hisayasu Nishino; Akio Yamada; Yoshihisa Oae; Hiroshi Yasuda, all of Kawasaki, Japan

[73] Assignee: Fujitsu Limited, Kanagawa, Japan

[21] Appl. No.: 39

[22] Filed: Jan. 4, 1993

[30] Foreign Application Priority Data

Jan. 13, 1992 [JP] Japan .................................. 4-004195

[51] Int. Cl.$^6$ .............................................. H01J 3/32
[52] U.S. Cl. ........................ 250/396 ML; 250/492.2; 335/210; 335/213
[58] Field of Search ......... 250/396 ML, 396 R, 492.2; 335/210, 213, 300

[56] References Cited

U.S. PATENT DOCUMENTS

| | | | |
|---|---|---|---|
| 3,707,628 | 12/1972 | Bassett et al. | 250/396 ML |
| 4,748,429 | 5/1988 | Aubert | 335/300 |
| 4,817,706 | 4/1989 | Miyama et al. | 335/300 |
| 5,101,638 | 4/1992 | White | 335/300 |
| 5,136,166 | 8/1992 | Young | 250/396 ML |

FOREIGN PATENT DOCUMENTS 2-232919  9/1990  Japan .

Primary Examiner—Paul M. Dzierzynski
Assistant Examiner—Kiet T. Nguyen
Attorney, Agent, or Firm—Nikaido Marmelstein Murray & Oram

[57] ABSTRACT

A charged particle beam exposure method for deflecting a charged particle beam in a deflection system which includes electromagnetic deflection coils, includes the steps of (a) controlling the deflection system based on deflection data, and (b) generating heat at least a vicinity of the electromagnetic deflection coils so as to compensate for a change in heat generated from the electromagnetic deflection coils.

20 Claims, 13 Drawing Sheets

Fig.3(A)
PRIOR ART
Fig.3(B)
PRIOR ART
Fig.3(C)
PRIOR ART
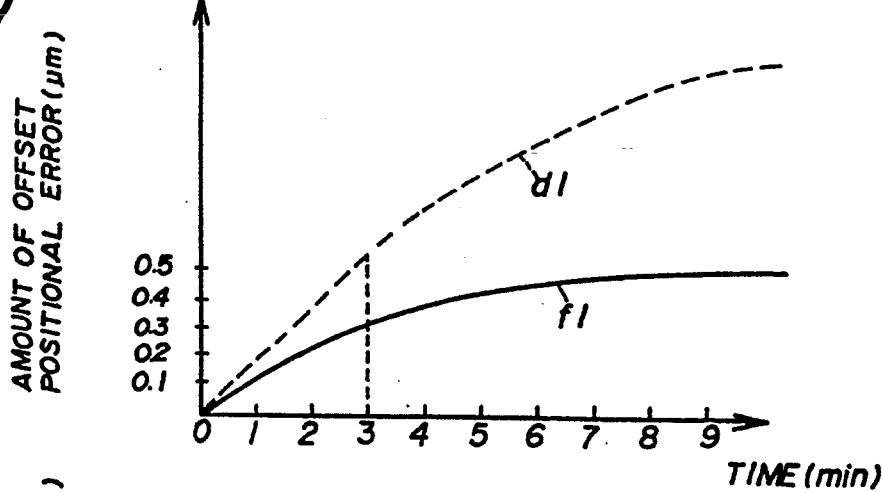
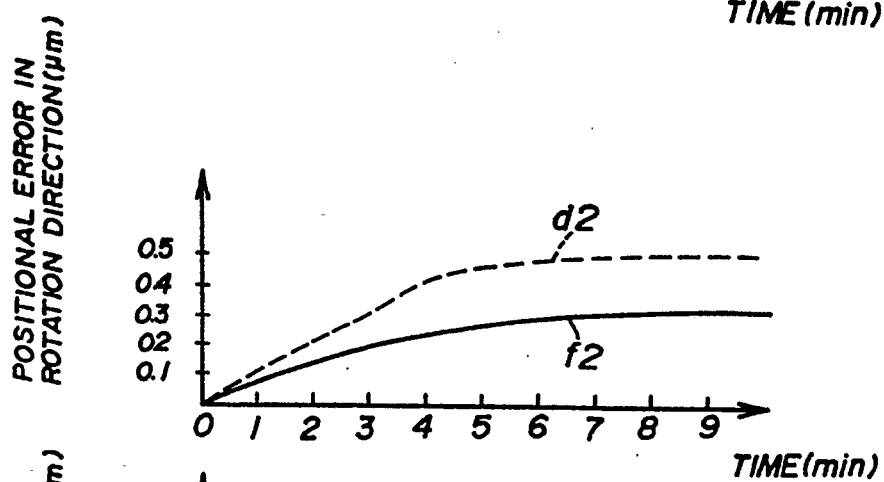
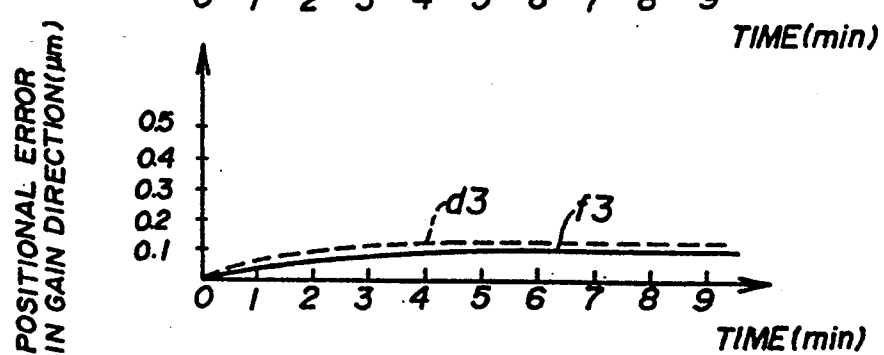

CHARGED PARTICLE BEAM EXPOSURE METHOD AND APPARATUS

BACKGROUND OF THE INVENTION

The present invention generally relates to charged particle beam exposure methods and apparatuses, and more particularly to a charged particle beam exposure method which is suited for realizing a high resolution electron mean exposure at a high throughput, and to a charged particle beam exposure apparatus which employs such a charged particle beam exposure method.

Recently, there is much attention on exposure techniques using a charged particle beam such as an electron beam because of the need to accurately expose extremely fine patterns to meet the increasing integration density of semiconductor integrated circuit devices. In order to realize a high throughput, the charged particle beam is shaped into a beam having an arbitrary cross sectional shape and the shaped beam is irradiated on a wafer. It is desirable that the numerical aperture is large in order to realize a high resolution, and it is desirable that the charged particle beam travels a short distance to the wafer so as to reduce the Coulomb interactions of the charged particle beam. For these reasons, an optical system of the charged particle beam has a short focal distance.

An electron beam exposure apparatus normally uses an electron beam which is shaped to have a rectangular cross section or a cross section having an arbitrary shape, and the shaped electron beam draws the pattern on the wafer. FIG. 1 shows the column structure of an example of a conventional electron beam exposure apparatus.

FIG. 1 shows a cross sectional view of the column structure in a vicinity of the wafer. An electron beam EB travels from the top to bottom along an optical axis O, and is irradiated on a wafer W. An electromagnetic lens is provided to converge the electron beam EB on the wafer surface. The electromagnetic lens includes an electromagnetic lens coil LC which is coupled to an iron yoke IY, and pole pieces PP are coupled to the tip end of the iron yoke IY.

In addition, electromagnetic deflection coils EC and electrostatic deflection electrodes EE are provided to deflect the electron beam EB. In order to shorten the focal distance, the electromagnetic deflection coils EC and the electrostatic deflection electrodes EE are arranged on the inner side of the electromagnetic lens.

In the example shown in FIG. 1, a support part S is arranged on the inner side of the electromagnetic lens, and the electromagnetic deflection coils EC are mounted on this support part S. Further, the electrostatic deflection electrodes EE are arranged on the inner side of the support part S.

The electron beam EB is deflected by the electromagnetic deflection coils EC when deflecting the electron beam EB for a relatively large amount on the order of several mm, for example. On the other hand, the electron beam EB is deflected by the electrostatic deflection electrodes EE when deflecting the electron beam EB at a high speed for a relatively small amount on the order of 100 μm, for example.

In the case of the electron beam exposure which exposes a relatively large area in one exposure, the Coulomb interactions of the charged particles cause problems. The focal distance of the optical system is shortened in order to eliminate the limit of the resolution caused by the Coulomb interactions. However, the deflection efficiency of the deflector deteriorates if the focal distance is shortened. Accordingly, in the electron beam exposure system having the shortened focal distance, a large current must be applied to the electromagnetic deflection coils EC in order to obtain a desired amount of deflection.

FIG. 2 shows a perspective view of the electromagnetic deflection coils EC. The electromagnetic deflection coils EC have a saddle shape, and are fixed at mutually confronting positions on the outer periphery of the support part S. The support part S has a cylindrical shape and is made of ceramics or the like.

According to the conventional electron beam exposure apparatus, the electron beam EB is deflected using the electromagnetic deflection coils EC provided in a plurality of stages, and the pattern is drawn on the wafer W by scanning the wafer surface by the deflected electron beam EB. The electromagnetic deflection coils EC are divided into two systems, that is, X and Y systems, depending on the operating direction. The electromagnetic deflection coils EC are coupled in series within each system. The electromagnetic deflection coils EC of the two systems receive driving currents from independent driving circuits.

For example, a current on the order of ±2 A is required to deflect the electron beam EB with a deflection efficiency is approximately 2.5 mm/1A in a main deflection region which is 2 mm×2 mm. Hence, if each electromagnetic deflection coil EC is formed from a copper wire having a diameter of 0.5 mm, the resistance thereof becomes approximately 1.5 Ω.

In order to avoid the Coulomb interactions of the charged particle beam, it is necessary to shorten the focal distance of the optical system of the charged particle beam. But if the focal distance is shortened, the deflection efficiency deteriorates, and a larger current is required if the same amount of deflection is to be obtained with the shortened focal distance.

In addition, in order to operate the electromagnetic deflection coils EC at a high speed, it is necessary to reduce the inductance, and thus, it is desirable to reduce the area of the electromagnetic deflection coils EC.

On the other hand, heat is locally generated within the column structure if the charged particle beam is processed using the electromagnetic deflection coils EC having the above described arrangement, and such a generation of heat is unavoidable. The generated heat ranges from several W to several tens of W, for example.

When the charged particle beam exposure apparatus of the type described above is used, the deflection position of the charged particle beam and the focal position (or point) of the charged particle beam drift with the operating time of the charged particle beam exposure apparatus. It may be regarded that the following causes the drift of the deflection position and the focal position of the charged particle beam.

(a) Changes in the outputs of an amplifier and a lens power source;

(b) An eddy current flowing to peripheral metal parts due to a change in the magnetic flux generated by the deflection coils;

(c) Charge-up of parts through which the charged particle beam passes;

(d) Changes in the position and dimension of the deflection coils with time; and (e) Changes in the positions and dimensions of the deflection coils themselves, bobbins and other parts due to temperature changes caused by the heat generated from the deflection coils.

The present inventors initially doubted the possibility that the response characteristic of the deflection coil greatly deteriorating with the operating time of the charged particle beam exposure apparatus. However, the output of the amplifier had not changed, and the set time constant remained the same. In addition, the inductance of the deflection coil also remained approximately the same. In other words, even though the deflection magnetic field was set, some factor changed the beam position. But it seemed impossible for the eddy current to change before and after the exposure when the same deflection was made.

Furthermore, the beam position on the optical axis is reproducible for a long time if the charged particle beam is not deflected. For this reason, it seemed impossible for the charge-up to cause the deterioration of the response characteristic of the deflection coil.

The remaining possibility was the changes in the positions and dimensions of the deflection coils themselves, the bobbins and other parts such as the pole pieces due to temperature changes caused by the heat generated from the deflection coils. As described above, the heat of several W to several tens of W may be generated from the electromagnetic deflection coil, and the radiation effect is poor if the electromagnetic deflection coils are arranged in a vacuum surrounding.

In the converging deflection system having the shortened focal distance, the lens magnetic pole becomes small because of the need to make the lens magnetic field strength large and the deflection magnetic field strength large. Consequently, the deflection coils which are provided on the inside must be arranged without a gap within a space which is narrow in both the direction of the optical axis and the radial direction. As a result, the part which holes the deflection coils is made extremely thin, and the heat capacity thereof is reduced to several fractions of that of the conventional case.

In addition, the difference between the radii of the deflection coils in the X and Y systems is small. But although the size of the deflection coil is reduced, the thickness of the wire member is approximately the same as that of the conventional case. For this reason, the thickness of the deflection coil in the direction in which the wire is overlapped is large, and the inner turns of the wire of the deflection coil are covered by the outer turns of the wire.

For this reason, even if the outer side of the deflection coil were air-cooled, the air-cooling effect would greatly differ between the outer turns of the wire and the inner turns of the wire. The inner turns of the wire of the deflection coil virtually cannot be air-cooled directly, and the cooling is in effect made via the thermal conduction of the bobbin. Hence, the cooling effect of the inner turns of the wire and the outer turns of the wire of the coil greatly differ.

If the deflection coil were made using a thin wire member in order to improve the air-cooling effect, the amount of heat generated from the deflection coil would increase. As a result, the deflection accuracy of the charged particle beam would further deteriorate due to the thermal expansion of the wire member itself and the thermal expansion of the bobbin on which the deflection coil is adhered.

In a case where a copper wire member is used for the deflection coil and the bobbin is made of ceramics, positional errors of 0.34 $\mu$m and 0.16 $\mu$m may respectively be generated in a main deflection region of 2 mm×2 mm when the temperature rises by 10° C., because the coefficient of thermal expansion of the deflection coil is $1.7\times10$ cm$^{-5}$ and the coefficient of thermal expansion of the bobbin is $8\times10$ cm$^{-6}$ in this case.

The deflection coil and the bobbin are actually adhered to each other, and it may be anticipated that the amount of positional error will take a value between 0.34 $\mu$m and 0.16 $\mu$m. Even if this anticipated value of the positional error were 0.2 $\mu$m, the positional error in the main deflection region would be 0.4 $\mu$m at the maximum. Such a positional error is too large when forming patterns on the submicron order.

There is yet a bigger problem to be solved. That is, the heat generated from the deflection coil causes the thermal expansion of the wire member itself and the thermal expansion of the bobbin on which the deflection coil is adhered. Furthermore, the heat generated from the deflection coil causes thermal expansion of ferrite pole pieces which form a projection lens. These thermal expansions change the deflecting direction and the deflection efficiency of the deflection coil and the lens magnetic field strength, and deteriorate the accuracy of the deflection position. The thermal expansion of the magnetic pole in particular introduces an error in the origin of the deflection coordinate and a focal error.

Particularly in the case of an exposure which is made while a stage carrying the wafer continuously moves, an alignment mark on the wafer is detected prior to the exposure and the exposure is started after determining correction coefficients for the exposure. For this reason, the deterioration of the accuracy of the exposure position, the error in the origin of the deflection coordinate and the focal error which occur during the exposure are fatal to the quality of the exposure.

FIG. 3 shows measured results of deviation components of the beam position when the main deflector is caused to generate heat continuously. In FIG. 3, (A) is a graph showing the change of the amount of error of the offset position with time, (B) is a graph showing the change of the positional error in the rotation direction with time, and (C) is a graph showing the change of the positional error in the gain direction with time.

When the main deflector is caused to generate heat continuously, these amounts of errors will change up to large values as indicated by dotted lines in FIG. 3. As may be seen from FIG. 3, these amounts of errors are fatal to the exposure apparatus which exposes patterns of the submicron order.

Accordingly, it is conceivable to cool the electromagnetic deflection coils which form the main deflector, so as to prevent the drift by suppressing the heating. The present inventors actually made electromagnetic deflection coils having a large cooling capacity and studied the results.

The tested electromagnetic deflection coil employed a double-structure bobbin which is made up of an inner bobbin and an outer bobbin to support the electromagnetic deflection coil. The wire member of the electromagnetic deflection coil was wound in the radial direction in one layer and overlapped in the rotating direction in an arcuate manner to form a desired number of coil turns. The electromagnetic deflection coil was then bent along a cylindrical surface in the form of a saddle shape.

In addition, saddle shape coils having different radii of curvatures were made. The coil having the smaller radius of curvature was fixed on the outer circumference of the inner bobbin, and the coil having the larger radius of curvature was fixed on the inner circumference of the outer bobbin. A space was formed between the inner and outer coils so as to form a passage for flowing a coolant in the direction of the optical axis.

The bobbin was formed to a structure which is independent or integral to the plurality of stages of the coils, and was made of a material including quartz as the main component and having a small coefficient of linear expansion. Pure water or He gas was used as the coolant, and the coolant was forcibly circulated.

The electromagnetic deflection coils of the main deflector were cooled efficiently by the above arrangement, so as to reduce the thermal conduction to the parts such as the pole pieces. It was thought that the temperature rise of the structure will be extremely small by the efficient radiation.

The positional changes in the electron beam for the case where the above described electromagnetic deflection coils are used are indicated by solid lines in FIG. 3. In FIG. 3, a curve f1 in (A) shows the amount of error of the offset position as a function of time when the cooling was made, a curve f2 in (B) shows the positional error in the rotating direction as a function of time when the cooling was made, and a curve f3 in (C) shows the positional error in the gain direction as a function of time when the cooling was made.

However, as may be seen from FIG. 3, even though the electromagnetic coils were cooled, the changes in the beam position were only reduced to one half of the case where no cooling was made.

For example, the amount of error of the offset position was approximately 0.5 $\mu$m after approximately 3 minutes from the start of the exposure when no cooling was made. But even when the cooling was made, the amount of error in the offset position was only reduced to approximately 0.3 $\mu$m. The amount of error of the offset position gradually saturated with time, and the amount of error was approximately 0.4 $\mu$m after the saturation which was not within a tolerable range.

In addition, compared to the case where no cooling was made, the positional error in the rotation direction was only reduced to approximately one-half even when the cooling was made. The reduction of the positional error in the gain direction by making the cooling was even smaller compared to the case where no cooling was made.

In other words, even though the cooling efficiency improved with respect to the heat generation, it was evident that the cooling was incomplete and that the temperature change in the structure occurred due to the heat generation. It is conceivable to increase the cooling capacity of the coolant so that the amount of heat generated can be neglected, but there is a possibility of introducing mechanical vibration or the like due to the increased flow rate if the flow rate of the coolant is increased. On the other hand, there is a limit to increasing the flow rate of the coolant. It is also conceivable to further reduce the thermal conduction from the electromagnetic deflection coils to the pole pieces and the like, but there is of course a limit to doing this.

The temperature rise of the pole pieces with respect to the generation of heat by the electromagnetic deflection coils was also measured. It was found that the temperature rise is approximately 1.5° C. in 10 minutes when no cooling was made and approximately 0.3° C. in 10 minutes when the cooling was made. The temperature rise saturated in approximately 10 minutes, and the saturation values greatly differ between the case where no cooling is made and the case where the cooling is made. That is, the cooling effect can be seen.

However, the cooling effect is far from sufficient for the purpose of satisfactorily improving the accuracy of the exposure system. The temperature change in the initial stage in particular is not very large, and the cooling effect within the time of approximately 3 minutes from the start of the exposure is not very notable with respect to the drift of the beam position.

In order to obtain the high accuracy required by the semiconductor integrated circuits, the tolerable range of the temperature change of the structure due to the heat generated by the main deflector should be less than 0.1° C. However, the cooling described above cannot realize such a small tolerable range.

SUMMARY OF THE INVENTION

Accordingly, it is a general object of the present invention to provide a novel and useful particle beam exposure method and apparatus in which the problems described above are eliminated.

Another and more specific object of the present invention is to provide a charged particle beam exposure method for deflecting a charged particle beam in a deflection system which includes electromagnetic deflection coils, comprising the steps of (a) controlling the deflection system based on deflection data, and (b) generating heat at least in a vicinity of the electromagnetic deflection coils so as to compensate for a change in heat generated from the electromagnetic deflection coils. According to the charged particle beam exposure method of the present invention, it is possible to prevent the position and dimension of parts such as pole pieces from changing due to thermal expansion even if the heat generated from the electromagnetic deflection coils changes. For this reason, it is possible to always stably determine the beam position and the focal position. As a result, it is possible to draw extremely fine patterns with a high accuracy. The charged particle beam exposure method of the present invention can prevent the change in the beam position based on the deflection of the charged particle beam particularly in a charged particle beam exposure apparatus which has a deflection system with a relatively short focal distance. In addition, the accuracy of the exposure can be guaranteed regardless of the operating time of the charged particle beam exposure apparatus, and the throughput can be improved considerably.

Still another object of the present invention is to provide a charged particle beam exposure apparatus comprising a deflection system including electromagnetic deflection coils for deflecting a charged particle beam, heat source means arranged in a vicinity of the electromagnetic deflection coils for generating heat, and control means for controlling the heat source means based on currents applied to the electromagnetic deflection coils, so as to compensate for a change in heat generated from the electromagnetic deflection coils by the heat generated from the heat source means. According to the charged particle beam exposure apparatus of the present invention, it is possible to prevent the position and dimension of parts such as pole pieces from changing due to thermal expansion even if the heat generated from the electromagnetic deflection coils changes. For this reason, it is possible to always stably determine the beam position and the focal position. As a result, it is possible to draw extremely fine patterns with a high accuracy. The charged particle beam exposure apparatus of the present invention can prevent the change in the beam position based on the deflection of the charged particle beam particularly when the deflection system has a relatively short focal distance. In addition, the accuracy of the exposure can be guaranteed regardless of the operating time of the charged particle beam exposure apparatus, and the throughput can be improved considerably.

Other objects and further features of the present invention will be apparent from the following detailed description when read in conjunction with the accompanying drawings.

BRIEF DESCRIPTION OF THE DRAWINGS

FIGS. 3(A–C) shows measured results of deviation components of the beam position when a main deflector is caused to generate heat continuously;

DESCRIPTION OF THE PREFERRED EMBODIMENTS

First, a description will be given of the operating principle of the present invention, by referring to FIGS. 4 and 5.

Figure 1:
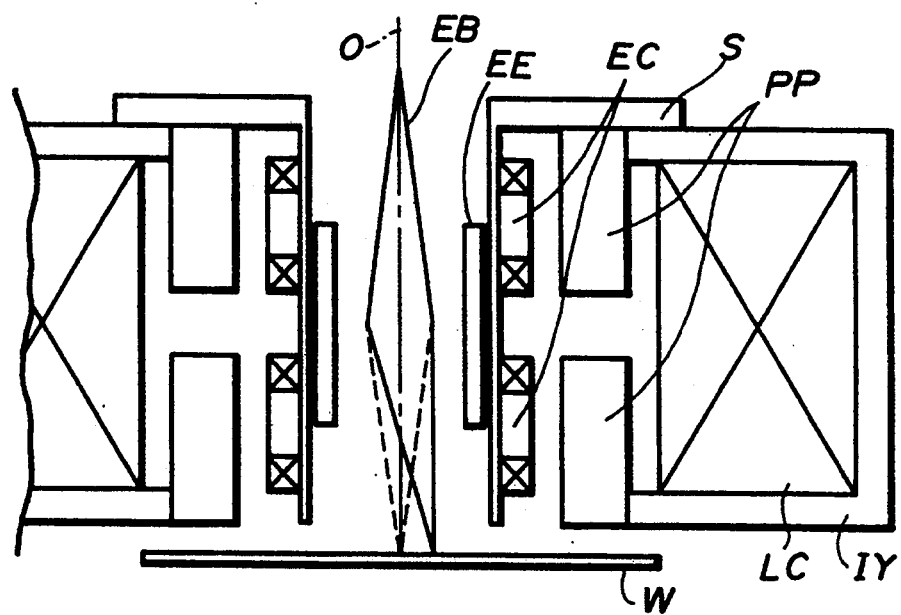
FIG. 1 is a cross sectional view showing a column structure of an example of a conventional electron beam exposure apparatus.
Figure 2:
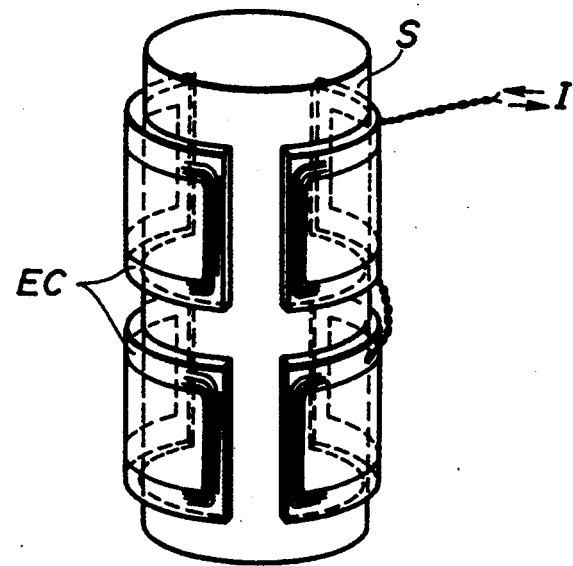
FIG. 2 is a perspective view showing electromagnetic deflection coils shown in FIG. 1.
Figure 4:
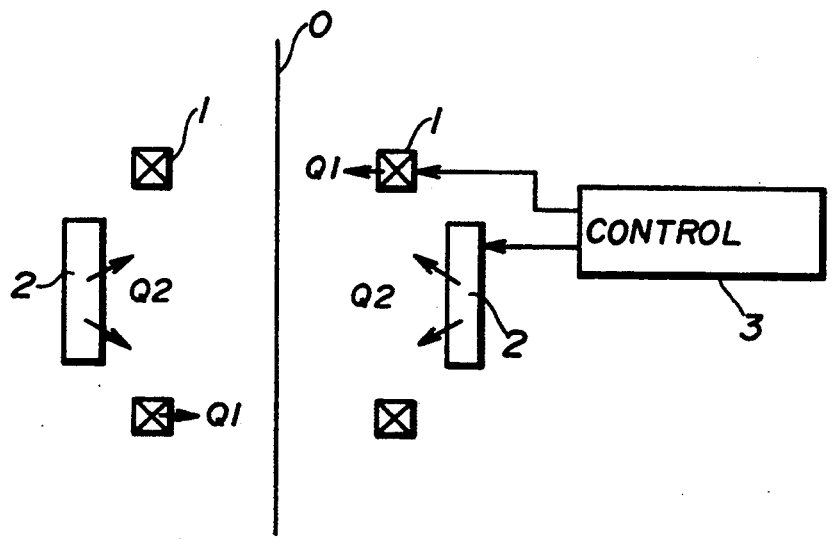
FIGS. 4 and 5 are diagrams for explaining the operating principle of the present invention.

FIG. 4 generally shows the construction of a charged particle beam exposure apparatus according to the present invention. Electromagnetic deflection coils 1 are arranged at positions surrounding an optical axis O, and a charged particle beam traveling along the optical axis O is deflected by generating a magnetic field thereby. A heat source 2 is arranged in a vicinity of the electromagnetic deflection coils 1. For example, this heat source 2 may be made up of a noninductive coil which is formed by a pair of twisted lines having the going and returning parts thereof twisted.

Heat Q1 is generated from the electromagnetic deflection coils 1 by a current which is applied to the electromagnetic deflection coils 1 for the purpose of deflecting the charged particle beam. On the other hand, heat Q2 is generated from the heat source 2. A control circuit 3 carries out a control so that a change in the heat Q1 is compensated by a change in the heat Q2.

By compensating the change in the heat Q1 generated by the current applied to the electromagnetic deflection coils 1 by the change in the heat Q2 which is generated from the heat source 2, it is possible to keep the effect of the heat which is generated as a whole with respect to the charged particle beam constant.

Figure 5:
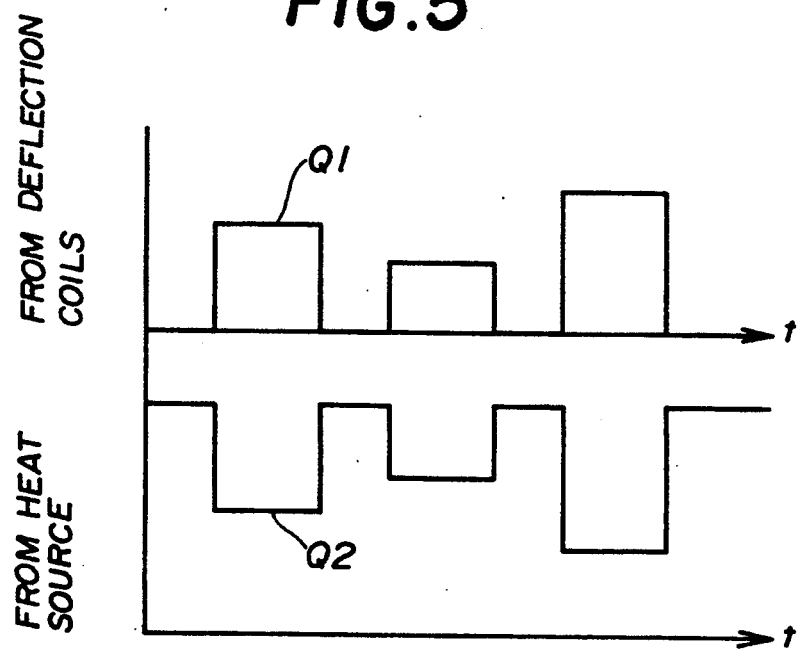

FIG. 5 generally shows the change in the heat Q1 generated from the electromagnetic deflection coils 1 and the change in the heat Q2 generated from the heat source 2. When the heat Q1 is generated from the electromagnetic deflection coils 1, the heat Q2 generated from the heat source 2 is changed so as to cancel the change in the heat Q1. Accordingly, the total effect of the heat Q1 and the heat Q2 with respect to the surrounding does not change and can be maintained constant.

For example, if the total amount of heat generated is constant, the effect of the heat on the surrounding does not change even if the current applied to the electromagnetic deflection coils 1 changes after the temperature change of the charged particle beam exposure apparatus saturates. For this reason, it is possible to prevent the drift of the charged particle beam due to the temperature change.

Figure 6:
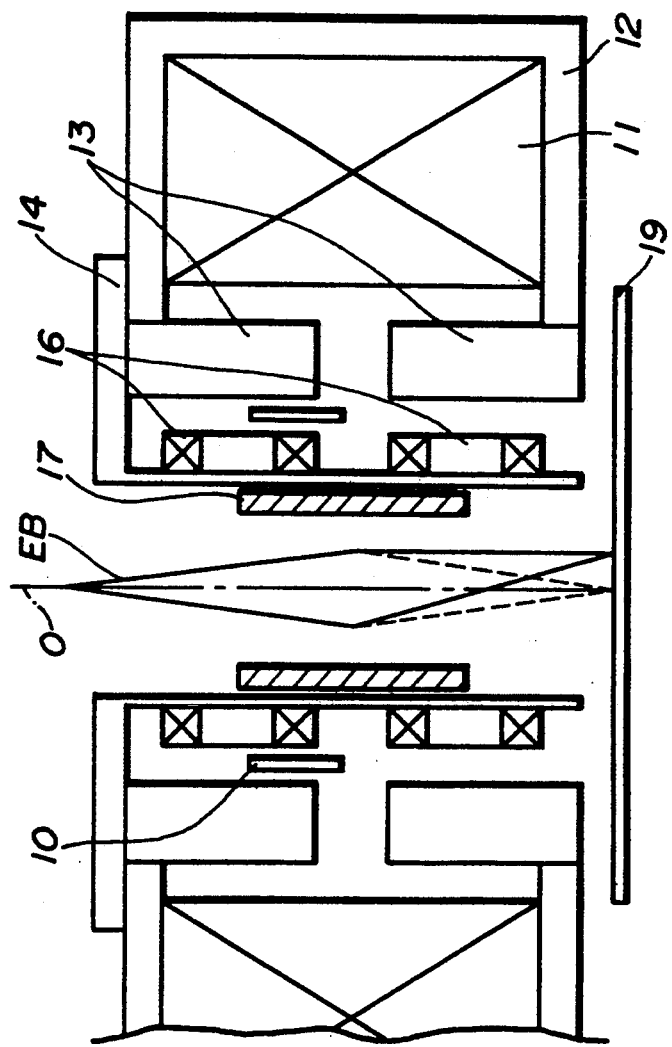
FIG. 6 is a cross sectional view showing a first embodiment of a charged particle beam exposure apparatus according to the present invention.
Figure 7:
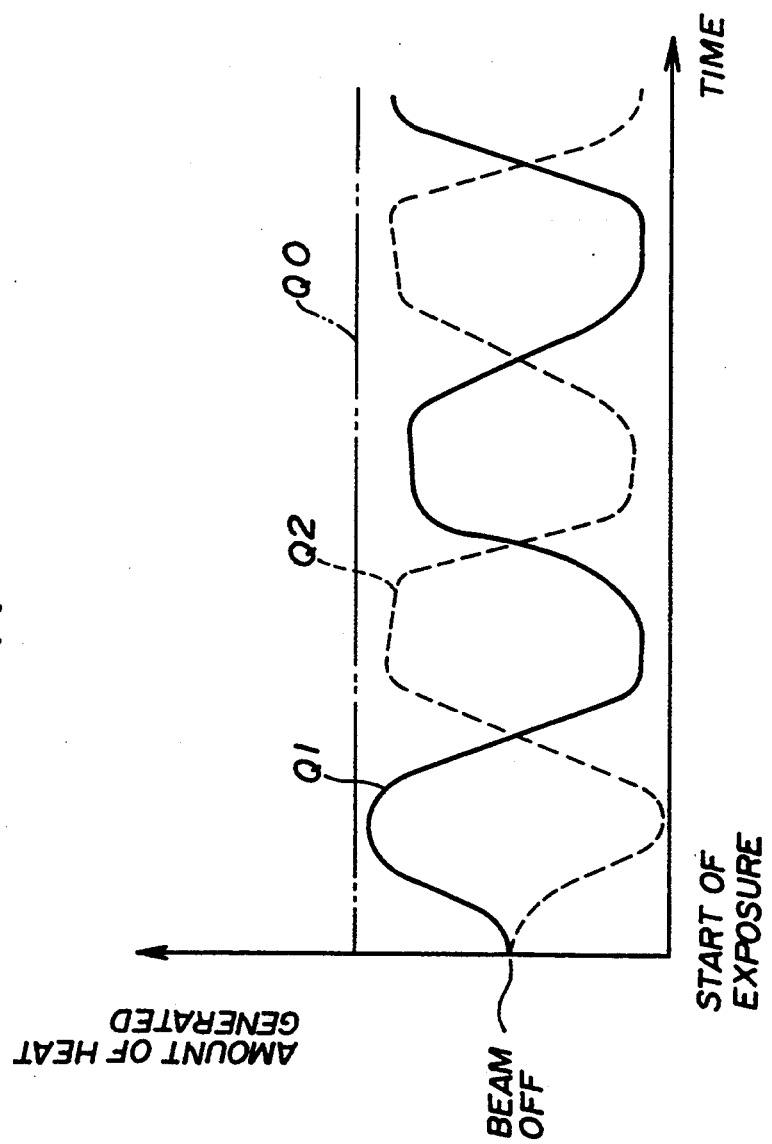
FIG. 7 is a graph for explaining the operation of the first embodiment.

Next, a description will be given of a first embodiment of the charged particle beam exposure apparatus according to the present invention, by referring to FIGS. 6 and 7. FIG. 6 shows a cross section of the first embodiment of the charged particle beam exposure apparatus, and FIG. 7 is a graph for explaining the operation of the first embodiment.

In FIG. 6, an electromagnetic lens coil 11 is magnetically coupled to an iron yoke 12. Pole pieces 13 made of ferrite or the like are magnetically coupled to the tip end of the iron yoke 12. A coil support part 14 is arranged on the inner side of the electromagnetic lens, and electromagnetic deflection coils 16 are mounted on the outer side of the coil support part 14.

Electrostatic deflection electrodes 17 are arranged at mutually confronting positions on the inner side of the coil support part 14. The number of electromagnetic deflection coils 16 and the number of electrostatic deflection electrodes 17 are shown in an abbreviated manner and does not necessarily correspond to the actual numbers so as to simplify the drawing. A heater body 10 is arranged in a vicinity of the outer side of the electromagnetic deflection coils 16. The heater body 10 is made of a resistor element, for example, and generates Joule heat when a current is applied thereto. As shown in FIG. 7, this current which is applied to the heater body 10 is controlled so that a sum of the heat Q2 generated from the heater body 10 and the heat Q1 generated from the electromagnetic deflection coils 16 becomes a constant value Q0.

In other words, if the heat Q1 generated from the electromagnetic deflection coils 16 changes as indicated by a solid line due to the current applied to the electromagnetic deflection coils 16, a current change for compensating for this change is applied to the heater body 10. Hence, the heat Q2 generated from the heater body 10 changes in the opposite direction to the change of the heat Q1 as indicated by a dotted line in FIG. 7, and the control is carried out so that the sum of the heat Q1 and the heat Q2 becomes the constant value Q0.

By the above described control, the heat Q0 which is generated from the electromagnetic deflection coils 16 and the heater body 10 as a whole is always maintained constant, and no temperature change occurs after the system once reaches the stable state.

When the charged particle beam is not irradiated on a wafer 19, it is desirable to apply a predetermined current to the electromagnetic deflection coil 16 as indicated by the "start of exposure" in FIG. 7, so that the generated heat Q1 is approximately one-half the total heat Q0 and the heat Q2 generated from the heater body 10 is approximately the same as the heat Q1.

Hence, by applying an idle current to the electromagnetic deflection coils 16 even when the charged particle beam is not irradiated on the wafer 19, it becomes possible to easily and quickly cope with the change in the current value regardless of the current value which is set when irradiating the charged particle beam on the wafer 19.

If a large current is to be applied to the electromagnetic deflection coils 16, it is desirable from the point of view of making a stable temperature compensation that a current is applied to the heater body 10 to a certain extent.

The temperature of the pole pieces 13 and the like rises because the electromagnetic deflection coils 16 and the heater body 10 as a whole always generate a constant amount of heat. Correction data for correcting the astigmatism, focal point, distortion and the like of the optical system are obtained in a state where the temperature rise has saturated, and a correction using the correction data is carried out at the time of the exposure.

Figure 8:
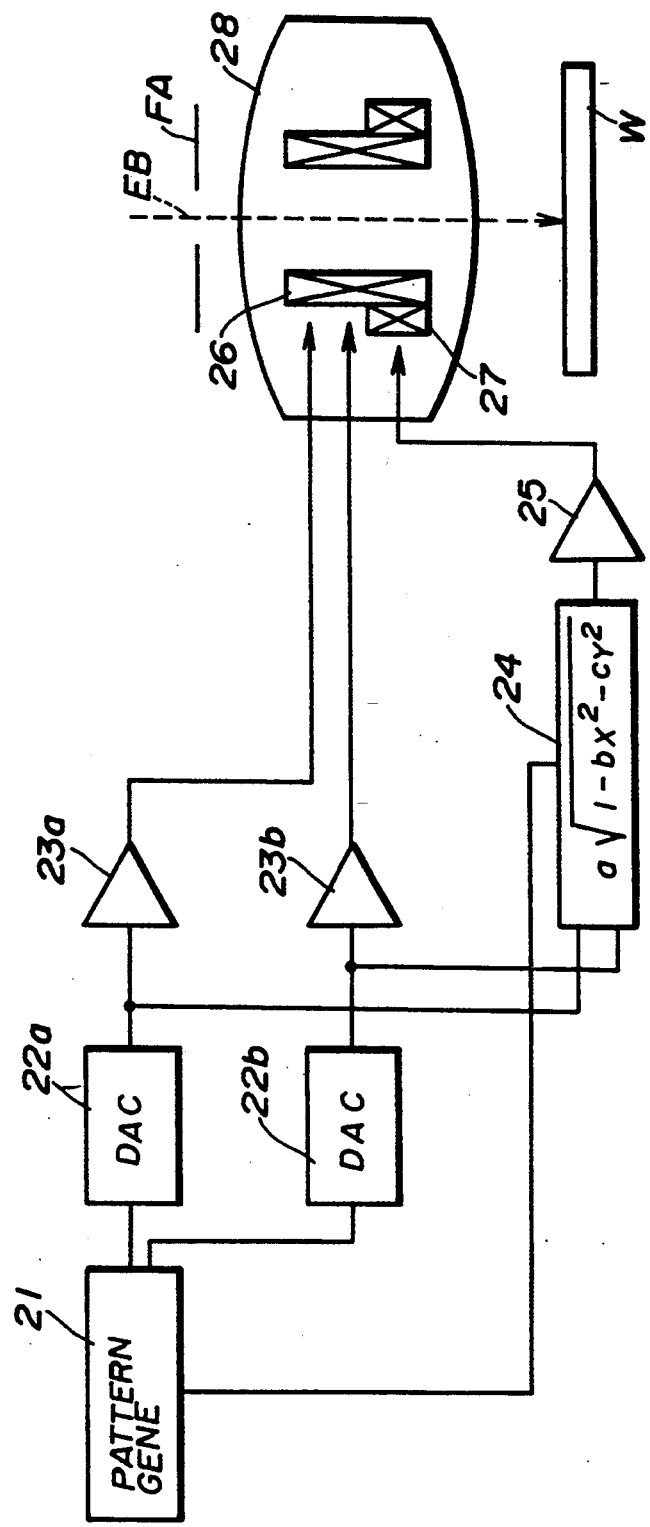
FIG. 8 is a system block diagram showing a second embodiment of the charged particle beam exposure apparatus according to the present invention.

FIG. 8 shows a second embodiment of the charged particle beam exposure apparatus according to the present invention. In this embodiment, the present invention is applied to an electron beam exposure apparatus.

In FIG. 8, a pattern generator 21 generates pattern data including a X-direction component and a Y-direction component. The X-direction component is supplied to a digital-to-analog converter (DAC) 22a, and the Y-direction component is supplied to a DAC 22b. Deflection data from the pattern generator 21 are also supplied to an analog operation circuit 24.

Deflection data which have been converted into analog form are supplied from the DACs 22a and 22b to respective electromagnetic deflection coil driving circuits 23a and 23b. The electromagnetic deflection coil driving circuits 23a and 23b generate driving currents for driving electromagnetic deflection coils 26.

The output signals of the DACs 22a and 22b are also supplied to the analog operation circuit 24. The analog operation circuit 24 supplies a control signal corresponding to $a(1-bX^2-cY^2)^{\frac{1}{2}}$ to a heater driving circuit 25, where "a" "b" and "c" denote correction coefficients which are set so that the total amount of heat generated from the electromagnetic deflection coils 26 and the compensation heater 27 becomes constant, and X and Y respectively denote the X-direction and Y-direction components. The heater driving circuit 24 generates a current corresponding to the amount of heat which is obtained by subtracting the amount of heat generated from the electromagnetic deflection coils 26 from a predetermined value. The output current of the heater driving circuit 24 is supplied to a compensation heater 27.

The electromagnetic deflection coils 26 generate a magnetic field for deflecting an electron beam EB, and also generate heat due to the current which flows through the electromagnetic deflection coils 26. The compensation heater 27 changes the heater generated therefrom so as to compensate for the change in the heat generated from the electromagnetic deflection coils 26.

In other words, the total amount of heat generated from the electromagnetic deflection coils 26 and the compensation heater 27 is maintained constant. For this reason, the effect of the heat to the surroundings caused by the electromagnetic deflection coils 26 and the compensation heater 27 does not change depending on the magnitude of the deflection, and is maintained constant. The electron beam EB passes through a final aperture FA and is converged on the wafer W by a projection lens 28. In addition, the electron beam EB is deflected to a desired position by the electromagnetic deflection coils 26.

The analog operation circuit 24 carries out an operation based on the pattern data so that the total amount of heat generated from the electromagnetic deflection coils 26 and the compensation heater 27 becomes constant, and supplies the control signal to the heater driving circuit 25.

Therefore, it is possible to prevent the beam position from drifting due to the temperature change by maintaining the amount of heat generated in the vicinity of the electromagnetic deflection coils 26 constant.

According to the conventional electron beam exposure apparatus, the drift of the electron beam position caused by the heat generated from the electromagnetic deflection coils was approximately 0.3 $\mu$m even when the electromagnetic deflection coils were cooled. However, according to this embodiment shown in FIG. 8, it was possible to reduce the drift of the electron beam position to approximately 0.05 $\mu$m.

Figure 9:
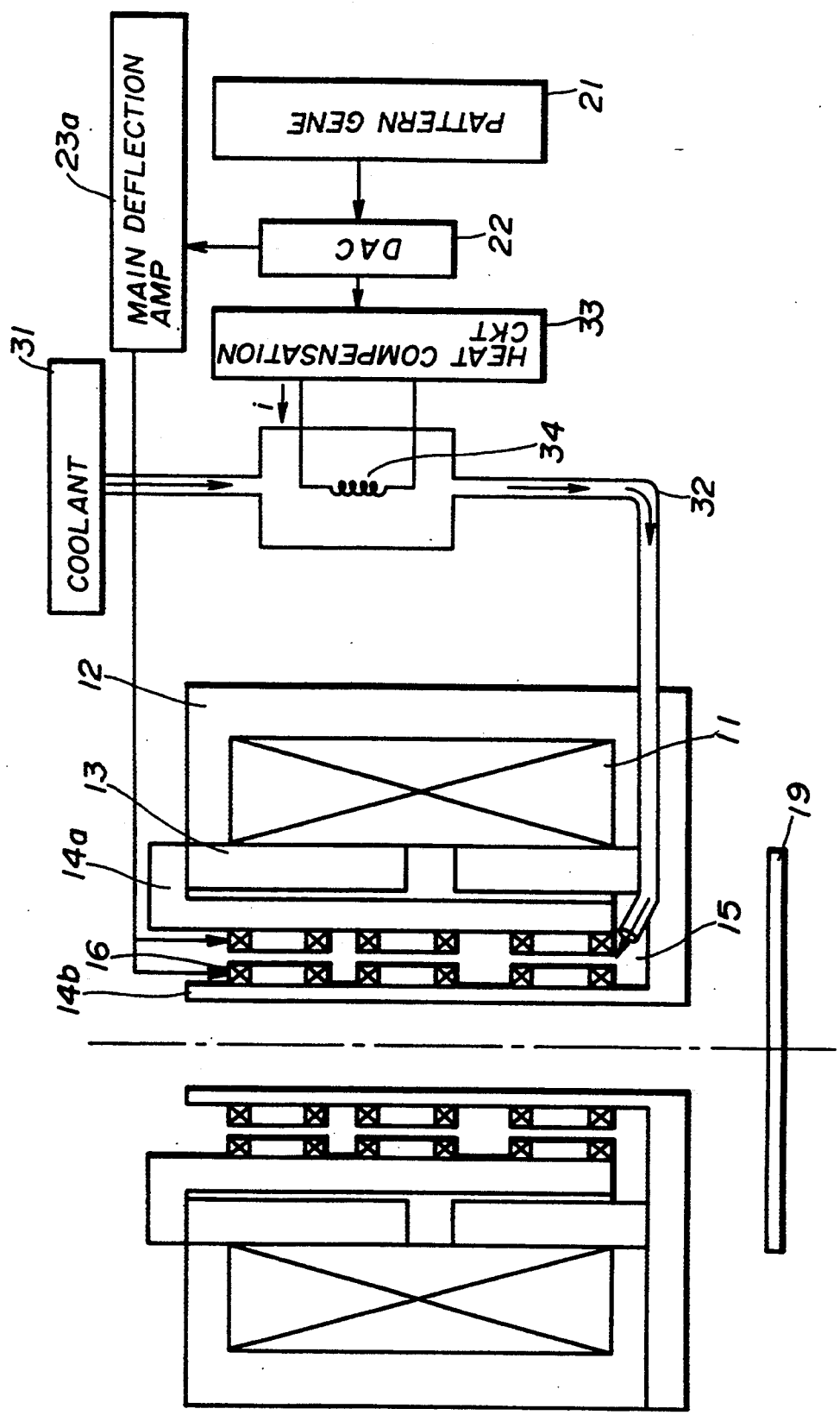
FIG. 9 is a diagram showing a third embodiment of the charged particle beam exposure apparatus according to the present invention.

FIG. 9 shows a third embodiment of the charged particle beam exposure apparatus according to the present invention. In FIG. 9, those parts which are the same as those corresponding parts in FIG. 6 are designated by the same reference numerals, and a description thereof will be omitted.

In this embodiment, a pair of coil support parts (hereinafter referred to as bobbins) 14a and 14b are arranged on the inner side of the electromagnetic lens to form a double structure. That is, a cylindrical space is defined by the inner bobbin 14b and the outer bobbin 14a, and a flow passage 15 is formed in this cylindrical space. The electromagnetic deflection coils 16 are divided into two parts, one part being fixed to the inner bobbin 14b and the other part being fixed to the outer bobbin 14a. The flow passage 15 passes an intermediate part between the two parts of the electromagnetic deflection coils 16.

The pattern generator 21 generates deflection data of the charged particle beam and supplies the deflection data to the DAC 22. The DAC 22 supplies the deflection data to a main deflection amplifier 23a so as to generate a current for driving the electromagnetic deflection coils 16.

The DAC 22 also supplies a signal corresponding to the deflection data to a heat compensation circuit 33, and variably sets a current i which is supplied to a heater body 34.

The heater body 34 is arranged within a coolant passage through which a coolant 31 flows. The coolant 31 which has made contact with the heater body 34 is supplied to the flow passage 15 within the electromagnetic lens via a coolant passage 32. This coolant 31 is supplied at a constant speed, but the current i which is supplied to the heater body 34 from the heater compensation circuit 33 is controlled by the deflection data and the cooling capacity is changed thereby. The current i is adjusted so that the sum of the heat generated from the electromagnetic deflection coils 16 in the vicinity of the electromagnetic lens and the heat from the coolant 31 becomes constant.

For this reason, the total amount of heat which is generated in the vicinity of the electromagnetic lens is maintained constant, similarly to the embodiment shown in FIG. 6. As a result, the temperature in the vicinity of the electromagnetic lens is maintained constant regardless of the magnitude of the deflection.

Figure 10:
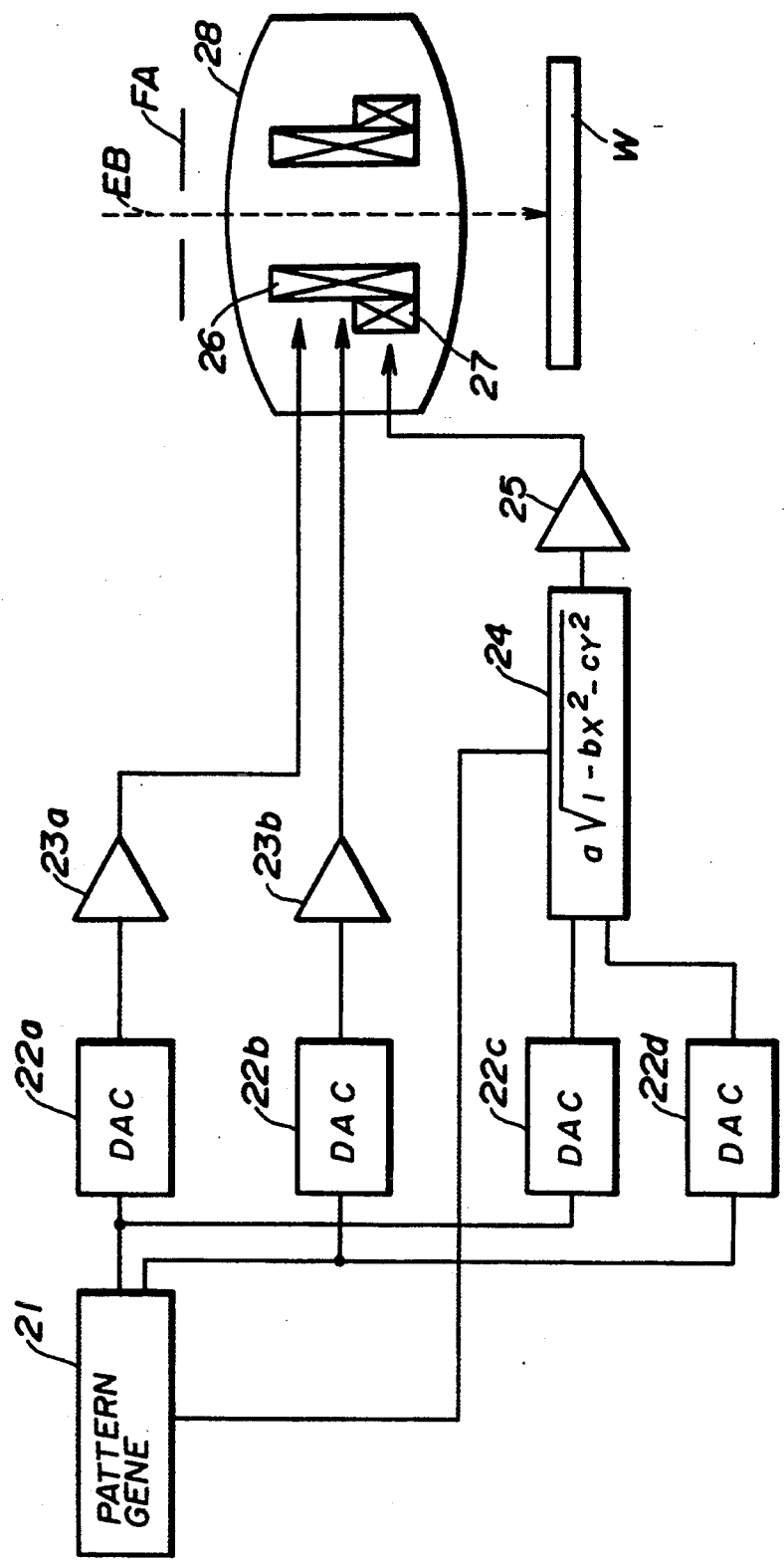
FIG. 10 is a system block diagram showing a fourth embodiment of the charged particle beam exposure apparatus according to the present invention.

FIG. 10 shows a fourth embodiment of the charged particle beam exposure apparatus according to the present invention. In FIG. 10, those parts which are the same as those corresponding parts in FIG. 8 are designated by the same reference numerals, and a description thereof will be omitted.

In this embodiment, the output signal of the pattern generator 21 is also supplied to DACs 22c and 22d. Signals from these DACs 22c and 22d corresponding to the amounts of deflection of the charged particle beam in the X and Y directions are supplied to the analog operation circuit 24.

Since the signals supplied to the electromagnetic deflection coil driving circuits 23a and 23b are independent from the signals supplied to the analog operation circuit 42, it is possible to prevent the data which is used to deflect the charged particle beam from being affected when the amount of heat generated from the compensation heater 27 is controlled.

In addition, it is easier to adjust the current which is supplied to the compensation heater 27 independently of the signals which are applied to the electromagnetic deflection coils 26.

In the embodiments described heretofore, a single heater body is arranged in the vicinity of the electromagnetic deflection coils. However, the heater body and the electromagnetic deflection coils are located at mutually different positions, and there are time differences among the times required for the heat generated from the heater body and the heat generated from the electromagnetic deflection coils to be transferred to the pole pieces. When compensating for the change in the heat generated from the electromagnetic deflection coil by the change in the heat generated from the heater body, a deviation is introduced due to the time differences of the heat transfers in the transient state if a single heater body is used, and the compensation of the change of the heat generated from the electromagnetic deflection coil becomes limited.

For example, if the current value supplied to the electromagnetic deflection coil is greatly changed, it is difficult to completely compensate for the change in the heat generated from the electromagnetic coil by the heat generated from the heater body.

Figure 11:
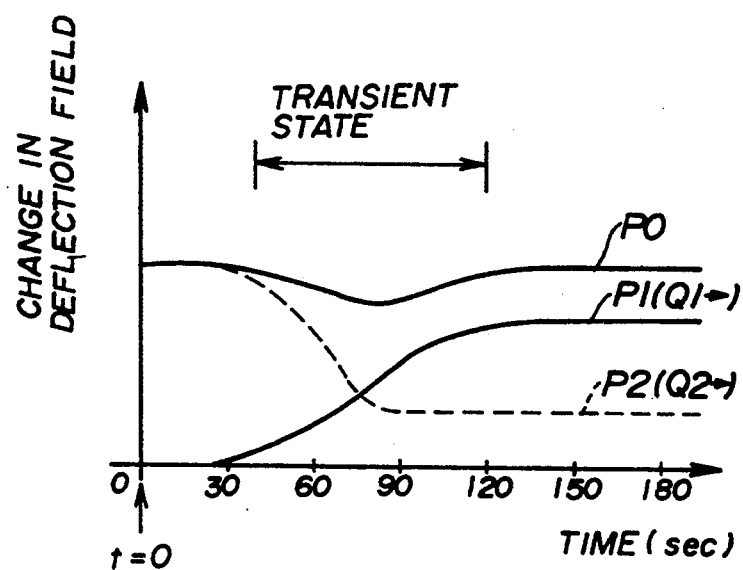
FIG. 11 is a diagram for explaining the limit of the compensation using a single heater body.

FIG. 11 generally shows the limit of the compensation using a single heater body. In FIG. 11, the abscissa indicates the time in seconds, and the ordinate indicates the change of the deflection field, that is, the change in the position to which the electron beam is actually deflected in response to the same deflection data. For example, the ordinate indicates the amount of drift of the field center.

In FIG. 11, P0 indicates the total change which is the sum of the changes caused by the heat generated from the electromagnetic deflection coils and the heat generated from the heater body. It is assumed for the sake of convenience that the current value supplied to the electromagnetic deflection coil is greatly changed at a time $t=0$.

In addition, P1 indicates the change in the deflection field when no current is supplied to the heater body and the electromagnetic deflection coils generate the heat. Furthermore, P2 indicates the change in the deflection field when no current is supplied to the electromagnetic deflection coil and the a current is supplied only to the heater body.

The deflection current supplied to the electromagnetic deflection coil and the compensation current supplied to the heater body are selected to such value that the deflection field does not change after a sufficiently long time elapses. However, even though the deflection and compensation currents are so selected, a change occurs in the deflection field in the transient state. FIG. 11 shows a case where the deflection field dips, but the deflection field may rise depending on the arrangement of the heater body.

By providing the heater body and compensating for the change in the amount of heat generated from the electromagnetic deflection coils by the change in the amount of heat generated from the heater body, it is possible to greatly reduce the change in the deflection field. But it is extremely difficult to completely prevent the deflection field from changing also in the transient state.

Next, a description will be given of other embodiments of the charged particle beam exposure apparatus according to the present invention which can sufficiently prevent the deflection field from changing in the transient state.

Figure 12:
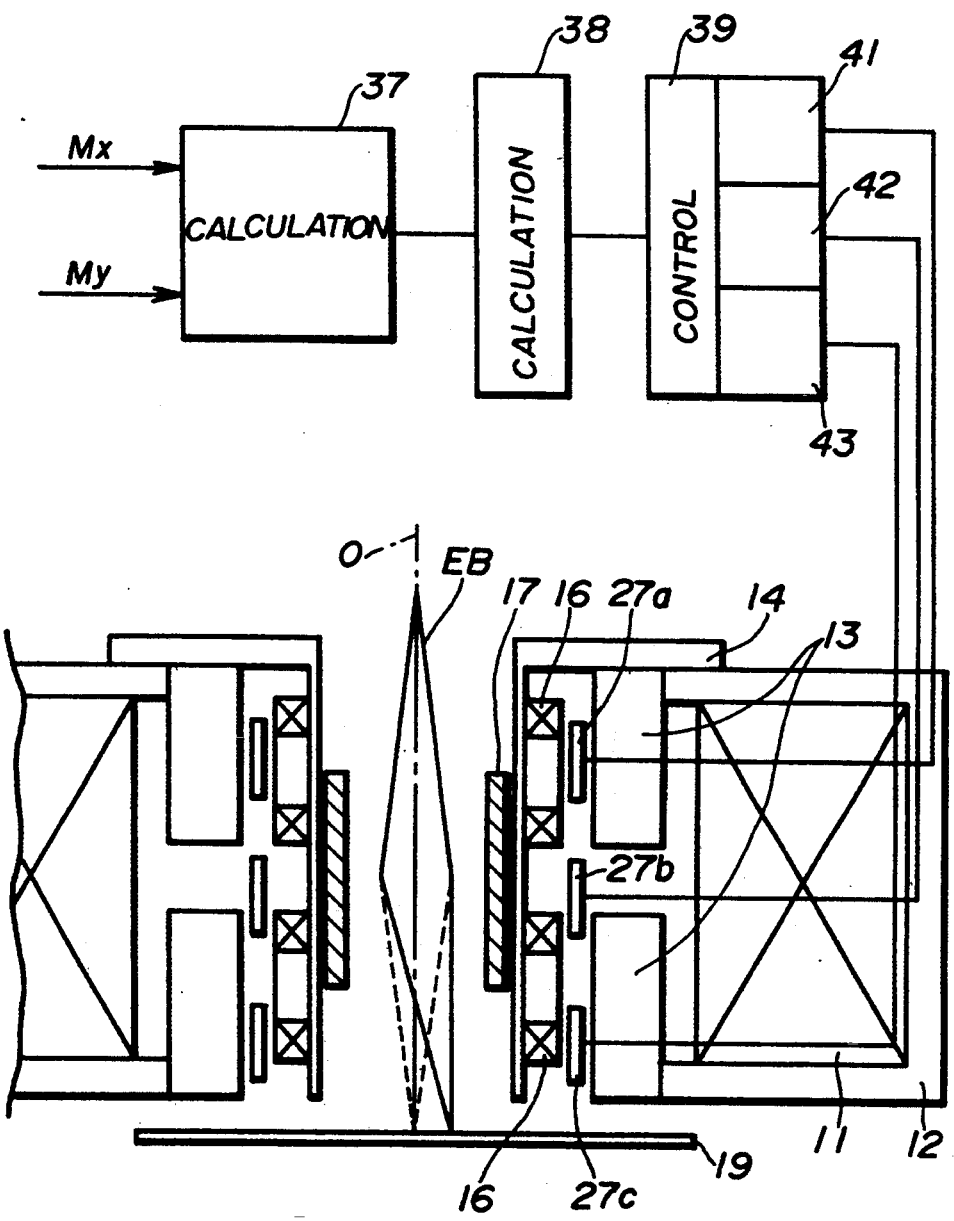
FIG. 12 is a diagram showing a fifth embodiment of the charged particle beam exposure apparatus according to the present invention.

FIG. 12 shows a fifth embodiment of the charged particle beam exposure apparatus according to the present invention. In FIG. 12, those parts which are the same as those corresponding parts in FIG. 6 are designated by the same reference numerals, and a description thereof will be omitted.

In this embodiment, three heater bodies 27a, 27b and 27c which are arranged in the vicinity of the electromagnetic deflection coils 16 at positions distributed above and below the effective center of the electromagnetic deflection coils 16. In addition, a control circuit 39 which includes heater driving circuits 41, 42 and 43 for independently supplying currents to the heater bodies 27a, 27b and 27c is provided as shown in FIG. 12.

Deflection data Mx and My of the electromagnetic deflection coil 16 are supplied to the electromagnetic deflection coil driving circuits (not shown) and to a calculation circuit 37 which calculates the amount W of heat generated from the electromagnetic deflection coil 16.

A calculation circuit 38 calculates the amount of heat to be generated by the heater bodies 27a, 27b and 27c by subtracting the amount W of heat generated from the electromagnetic deflection coils 16 from a predetermined amount Wo of heat which is to be generated. The calculated amount of heat to be generated by the heater bodies 27a, 27b and 27c is supplied to the control circuit 39, and the control circuit 39 obtains the amount of heat to be generated by each of the heater bodies 27a, 27b and 27c based thereon. The driving circuits 41, 42 and 43 supply currents which are based on the calculation to the heater bodies 27a, 27b and 27c so as to generate heat.

The heater bodies 27a, 27b and 27c are arranged in the vicinity of the electromagnetic deflection coils 16, but the positions thereof mutually differ. Hence, the transfer characteristic with which the heat is transferred to the pole pieces 13 of the electromagnetic lens differ for each of the heater bodies 27a, 27b and 27c.

Figure 13:
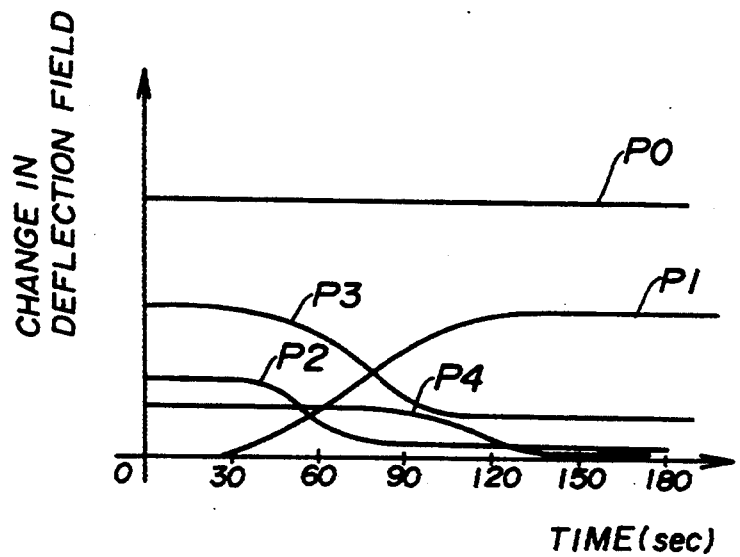
FIG. 13 is a diagram for explaining the change in the deflection field of the fifth embodiment.

Accordingly, by adjusting the amounts of heat to be generated from the heater bodies 27a, 27b and 27c, it is possible to set the effective heat transfer time of each of the heater bodies 27a, 27b and 27c identical to those of the electromagnetic deflection coils 16, so as to adjust the effects of the heat to the surrounding parts such as the pole pieces 13. As a result, it is possible to maintain the total effect of the heat on the surrounding parts constant even in the transient state as shown in FIG. 13. In FIG. 13, P2, P3 and P4 respectively indicate the independent effects of the heater bodies 27a, 27b and 27c on the change of the deflection field.

Therefore, this embodiment can further reduce the change in the deflection field in the transient state by arranging the plurality of heater bodies in the central part of the electromagnetic deflection coils at mutually different positions along the optical axis, and by setting mutually different heat transfer characteristics to the heater bodies.

Figure 14:
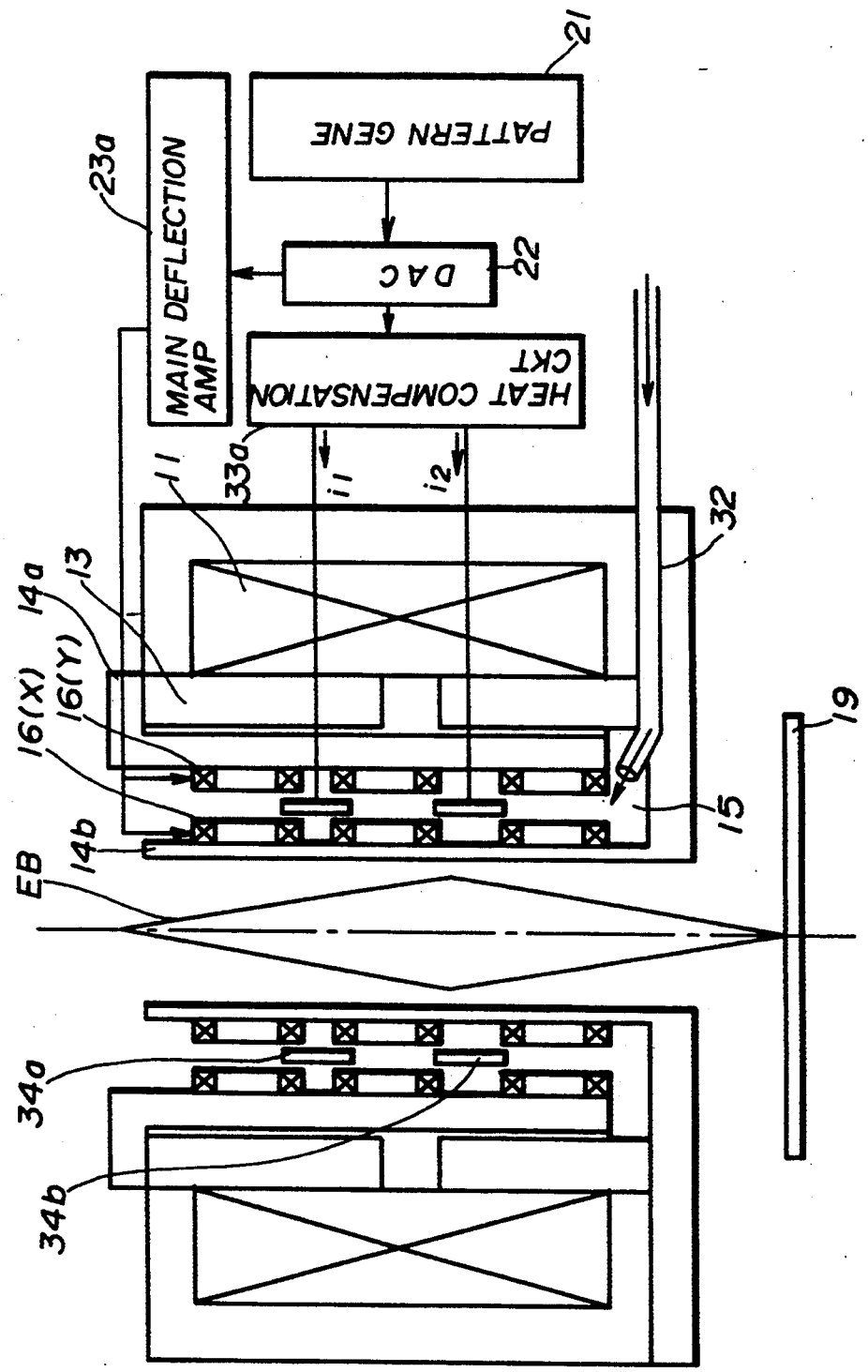
FIG. 14 is a diagram showing a sixth embodiment of the charged particle beam exposure apparatus according to the present invention.

FIG. 14 shows a sixth embodiment of the charged particle beam exposure apparatus according to the present invention. In FIG. 14, those parts which are the same as those corresponding parts in FIG. 9 are designated by the same reference numerals, and a description thereof will be omitted. In this embodiment, a coolant is used as in the case of the embodiment shown in FIG. 9, and a plurality of heater bodies are arranged in the flow passage on the inner side of the electromagnetic lens.

In FIG. 14, electromagnetic deflection coils 16(X) and 16(Y) are arranged within the flow passage 15 which is formed by the coil support parts 14a and 14b. In addition, two heater bodies 34a and 34b are respectively arranged within the flow passage 15 in the vicinity of the electromagnetic deflection coils 16(X) and 16(Y) above and below the electromagnetic deflection coils 16(X) and 16(Y) along the optical axis.

The pattern generator 21 supplies the deflection data of the charged particle beam to the DAC 22, and the DAC 22 supplies the driving current to the electromagnetic deflection coils 16 via the main deflection amplifier 23a. The DAC 22 also supplies the deflection data to a heat compensation circuit 33a. The heat compensation circuit 33a generates currents $i_1$ and $i_2$ which are respectively to be supplied to the heater bodies 34a and 34b based on the deflection data.

The heater bodies 34a and 34b are arranged at positions within the flow passage 15 having mutually heat transfer characteristics with respect to the pole pieces 13. Hence, the effects of the heat generated from the heater bodies 34a and 34b with respect to the surrounding parts such as the pole pieces 13 are mutually different. By adjusting the amounts of heat generated from the heater bodies 34a and 34b, it is possible to reduce the change in the deflection field in the transient state, similarly as in the case of the embodiment shown in FIG. 12.

Figure 15:
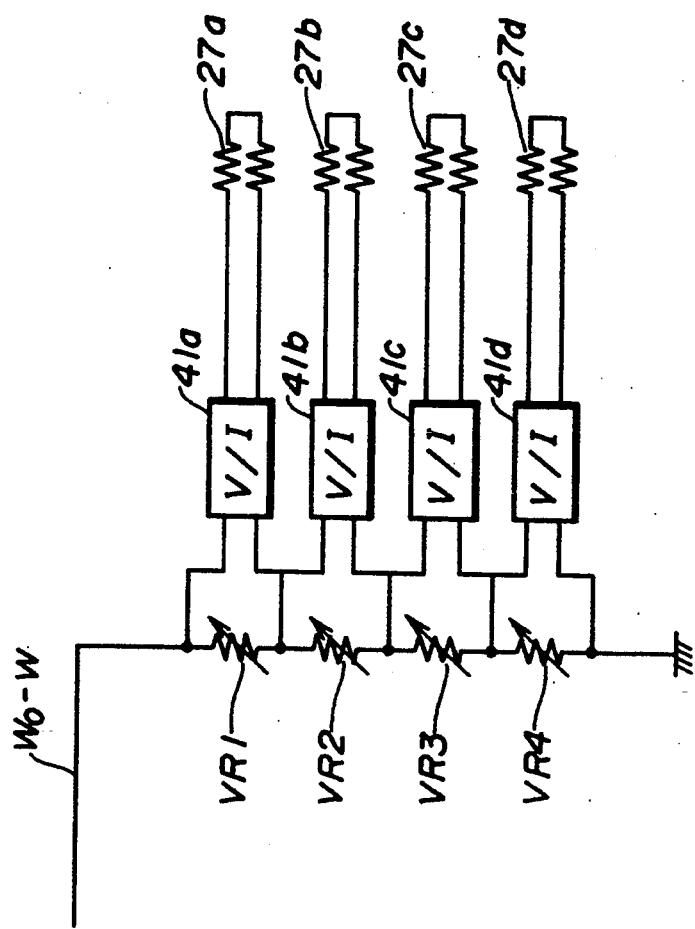
FIG. 15 is a circuit diagram showing an embodiment of a control circuit.

FIG. 15 shows an embodiment of a control circuit which can independently control the currents which are to be supplied to a plurality of heater bodies. In FIG. 15, it is assumed for the sake of convenience that four heater bodies 24a, 24b, 24c and 24d are provided, and that the currents are supplied from four current sources 41a, 41b, 41c and 41d.

The current sources 41a, 41b, 41c and 41d are voltage-current converter circuits which convert an input voltage into a current value, and respectively have variable resistors VR1, VR2, VR3 and VR4 connected to an input end thereof. The variable resistors VR1, VR2, VR3 and VR4 are connected in series, and one end of this series connection is grounded while the other end of this series connection receives a signal proportional to (Wo-W).

In other words, (Wo-W) is a signal proportional to the amount of heat which is to be generated from the heater bodies 27a, 27b, 27c and 27d as a whole. The ratio of the amounts of heat to be generated by the four heater bodies 27a through 27d can be variably adjusted by adjusting the variable resistors VR1 through VR4 to make a transient effect on the charged particle beam a minimum when the currents supplied to the electromagnetic deflection coils.

In the embodiments shown in FIGS. 12 and 14, for example, the amount of heat to be generated by the plurality of heater bodies as a whole may be derived theoretically, but it is more desirable to determine the amount of heat experimentally.

For example, currents are independently supplied to each of the plurality of heater bodies, and a change in the deflection field which occurs in this case is measured. In addition, the change in the deflection field is measured for various deflection data. Then, the ratio of the amounts of heat to be generated by each of the heater bodies in order to carry out the compensation is obtained based on the deflection data. Moreover, currents are actually supplied to the electromagnetic deflection coils and the heater bodies so as to obtain the changes thereof, and the current values to be supplied to each of the heater bodies are finally determined.

When carrying out the compensation by the heat generated from the heater bodies, the temperature of the entire system rises. Hence, it is desirable to adjust each part of the structure so that the astigmatism, focal point correction, distortion correction and the like of the optical system can be made in the state where the temperature has risen.

Even if the heater body generates a slight magnetic field, the current which flows through the heater body is synchronized to the current setting of the main deflector, and the heat compensation is made at the time of each kind of correction map measurement. For this reason, the error in the beam position and the focal error caused by the magnetic field generated by the heater body are taken into account in the correction map.

With respect to the time lag of the temperature change caused by the heat transfer, it is possible to take the following measures. That is, the heater bodies are divided into at least in two parts respectively above and below the central part of the main deflector along the optical axis. In addition, the amounts of heat generated by the heater bodies of the two parts are adjusted so that the effects of the heat generated from the heater bodies and the coils of the main deflector on the surrounding parts such as the pole pieces are made equivalent between the two parts. Hence, the effects of the heat transfer can be made equivalent between the two parts.

Accordingly, the temperature inside and outside the main deflector can always be maintained constant during the exposure and during the adjustment, and the surrounding parts such as the pole pieces will not change in position or dimension due to thermal expansion. As a result, the beam position and focal position are always stably determined, thereby making it possible to draw the patterns with a high accuracy.

of course, the number of heater bodies is not limited to 3, and it is possible to provide 2 or more than 3 heater bodies.

Figure 16:
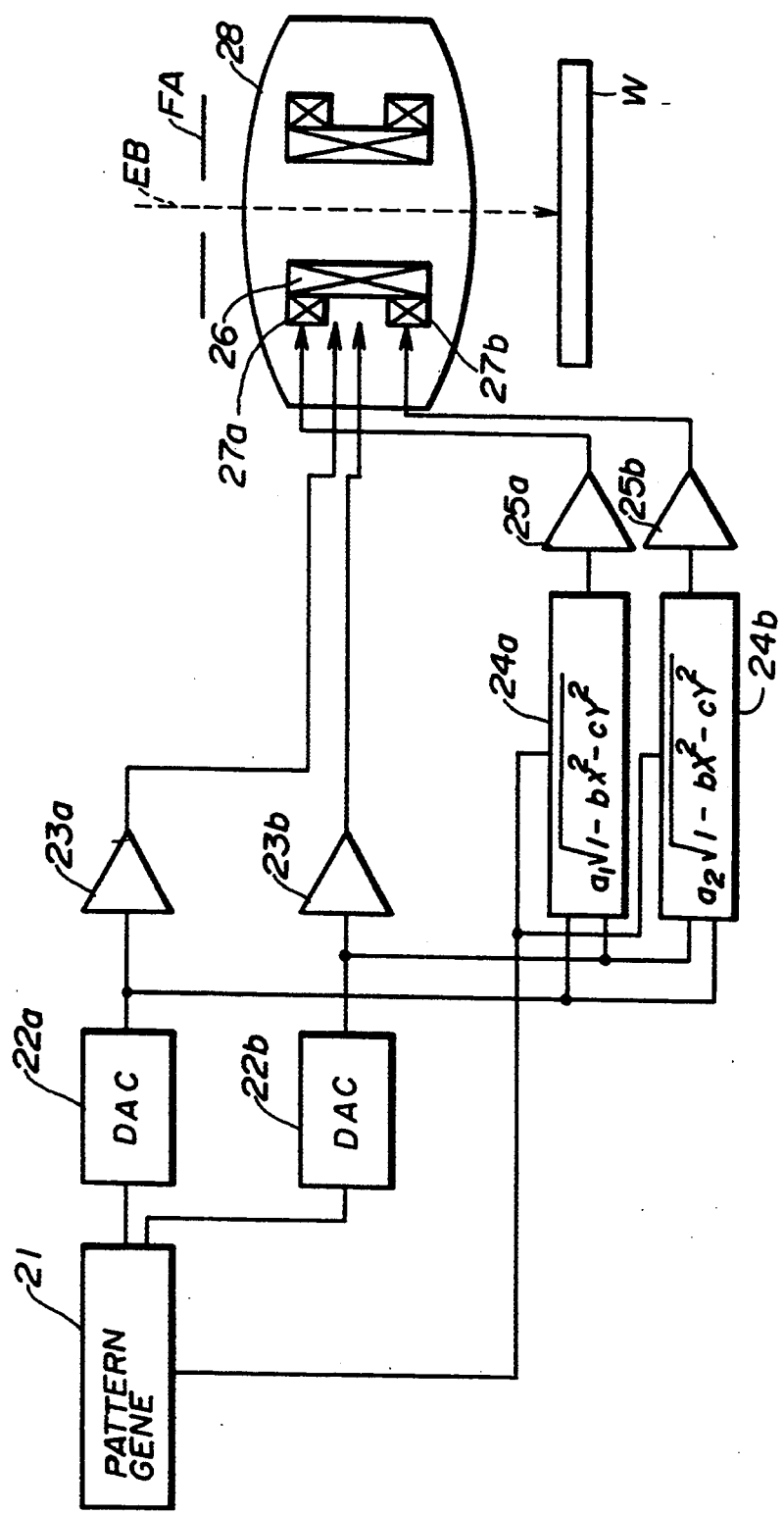
FIG. 16 is a system block diagram showing a seventh embodiment of the charged particle beam exposure apparatus according to the present invention.

FIG. 16 shows a seventh embodiment of the charged particle beam exposure apparatus according to the present invention. In FIG. 16, those parts which are the same as those corresponding parts in FIG. 8 are designated by the same reference numerals, and a description thereof will be omitted. In this embodiment, two heater bodies 27a and 27b are provided.

As shown in FIG. 16, two analog operation circuits 24a and 24b and two heater driving circuits 25a and 25b are respectively provided to drive the heater bodies 27a and 27b. The analog operation circuit 24a supplies a control signal corresponding to $a_1(1-bX^2-cY^2)^{\frac{1}{2}}$ to the heater driving circuit 25a, where "$a_1$" denotes a correction coefficient. The analog operation circuit 24b supplies a control signal corresponding to $a_2(1-bX^2-cY^2)^{\frac{1}{2}}$ to the heater driving circuit 25b, where "$a_2$" denotes a correction coefficient.

Further, the present invention is not limited to these embodiments, but various variations and modifications may be made without departing from the scope of the present invention.

What is claimed is:

1. A charged particle beam exposure method for deflecting a charged particle beam in a deflection system which includes electromagnetic deflection coils, said charged particle beam exposure method comprising the steps of:
   (a) controlling the deflection system based on deflection data including currents applied to the electromagnetic deflection coils; and
   (b) generating heat based on deflection data including said currents applied to the electromagnetic deflection coils in at least a vicinity of the electromagnetic deflection coils so as to compensate for a change in heat generated from the electromagnetic deflection coils.

2. The charged particle beam exposure method as claimed in claim 1, wherein said step (b) generates the heat by controlling heat source means arranged in the vicinity of the electromagnetic deflection coils.

3. The charged particle beam exposure method as claimed in claim 2, wherein said step (b) controls the heat source means so that a total amount of heat generated from the electromagnetic deflection coils and the heat source means is approximately constant.

4. The charged particle beam exposure method as claimed in claim 2, wherein said step (a) supplies a constant current to the electromagnetic deflection coils even during a time in which no irradiation of the charged particle beam on an exposure surface is made.

5. The charged particle beam exposure method as claimed in claim 4, wherein said step (a) supplies a current to the electromagnetic deflection coils and to the heat source means even during a time when said deflection data is not received.

6. The charged particle beam exposure method as claimed in claim 2, wherein said step (b) uses a heated fluid which flows at a constant flow rate as the heat source means.

7. The charged particle beam exposure method as claimed in claim 2, wherein said step (b) uses a single heater which is arranged in the vicinity of the electromagnetic deflection coils.

8. The charged particle beam exposure method as claimed in claim 2, wherein said step (b) uses a plurality of heaters which are arranged in the vicinity of the electromagnetic deflection coils.

9. A charged particle beam exposure method for deflecting a charged particle beam in a deflection system which includes electromagnetic deflection coils, said charged particle beam exposure method comprising the steps of:
   (a) controlling the deflection system based on deflection data; and
   (b) generating heat in at least a vicinity of the electromagnetic deflection coils so as to compensate for a change in heat generated from the electromagnetic deflection coils, wherein said step (b) generates the heat by controlling heat source means arranged in the vicinity of the electromagnetic deflection coils; and wherein the heat source means includes an electrical resistance, said step (a) supplies a current to the electromagnetic deflection coils, and said step (b) supplies to the electrical resistance a current which changes approximately in synchronism with a change in the current supplied to the electromagnetic deflection coils by said step (a).

10. A charged particle beam exposure method for deflecting a charge particle beam in a deflection system which includes electromagnetic deflection coils, said charged particle beam exposure method comprising the steps of:
    (a) controlling the deflection system based on deflection data including currents applied to the electromagnetic deflection coils;
    (b) generating heat in at least a vicinity of the electromagnetic deflection coils so as to compensate for a change in heat generated from the electromagnetic deflection coils, wherein said step (b) generates the heat by controlling heat source means arranged in the vicinity of the electromagnetic deflection coils, wherein said step (b) uses a plurality of heaters which are arranged in the vicinity of the electromagnetic deflection coils; and
    (c) obtaining beforehand a ratio of the amounts of heat to be generated by the plurality of heaters which makes a transient effect on the charged particle beam a minimum when the currents supplied to the electromagnetic deflection coils in said step (a) change.

11. A charged particle beam exposure apparatus comprising:
    a deflection system including electromagnetic deflection coils for deflecting a charged particle beam;
    heat source means arranged in a vicinity of the electromagnetic deflection coils for generating heat; and
    control means for controlling said heat source means based on currents applied to the electromagnetic deflection coils, so as to compensate for a change in heat generated from the electromagnetic deflection coils by the heat generated from said heat source means.

12. The charged particle beam exposure apparatus as claimed in claim 11, wherein said control means controls said heat source means so that a total amount of heat generated from the electromagnetic deflection coils and said heat source means is approximately constant.

13. The charged particle beam exposure apparatus as claimed in claim 11, which further comprises driving means for supplying a constant current to the electromagnetic deflection coils even during a time in which no irradiation of the charged particle beam on an exposure surface is made via said deflection system.

14. The charged particle beam exposure apparatus as claimed in claim 13, wherein said driving means supplies a current to the electromagnetic deflection coils and to the heat source means even during a time when deflection data is not received.

15. The charged particle beam exposure apparatus as claimed in claim 11, wherein said heat source means includes means for heating a fluid, and means for flowing the heated fluid at a constant flow rate.

16. The charged particle beam exposure apparatus as claimed in claim 11, wherein said heat source means includes a single heater which is arranged in the vicinity of the electromagnetic deflection coils.

17. The charged particle beam exposure apparatus as claimed in claim 11, wherein said heat source means includes a plurality of heaters which are arranged in the vicinity of the electromagnetic deflection coils.

18. The charged particle beam exposure apparatus as claimed in claim 17, wherein said control means controls the heat generated from said heat source means based on an anticipated amount of heat to be generated from the electromagnetic deflection coils.

19. A charged particle beam exposure apparatus comprising:
a deflection system including electromagnetic deflection coils for deflecting a charged particle beam;
heat source means arranged in a vicinity of the electromagnetic deflection coils for generating heat; and
control means for controlling said heat source means based on currents applied to the electromagnetic deflection coils, so as to compensate for a change in heat generated from the electromagnetic deflection coils by the heat generated from said heat source means, wherein said control means supplies to said heat source means currents which change respectively approximately in synchronism with a change in the currents supplied to the electromagnetic deflection coils.

20. A charged particle beam exposure apparatus comprising:
a deflection system including electromagnetic deflection coils for deflecting a charged particle beam;
heat source means arranged in a vicinity of the electromagnetic deflection coils for generating heat, wherein said heat source means includes a plurality of heaters which are arranged in the vicinity of the electromagnetic deflection coils; and
control means for controlling said heat source means based on currents applied to the electromagnetic deflection coils, so as to compensate for a change in heat generated from the electromagnetic deflection coils by the heat generated from said heat source means, wherein said control means controls the plurality of heaters based on a ratio of the amounts of heat to be generated by the plurality of heaters which makes a transient effect on the charged particle beam a minimum when the currents supplied to the electromagnetic deflection coils change.

* * * * *